(12) United States Patent
Basu et al.

(10) Patent No.: US 9,048,363 B2
(45) Date of Patent: Jun. 2, 2015

(54) ELEMENTAL SEMICONDUCTOR MATERIAL CONTACT FOR HIGH INDIUM CONTENT INGAN LIGHT EMITTING DIODES

(71) Applicant: International Business Machines Corporation, Armonk, NY (US)

(72) Inventors: Anirban Basu, Elmsford, NY (US); Wilfried Haensch, Somers, NY (US); Bahman Hekmatshoartabari, White Plains, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 57 days.

(21) Appl. No.: 13/897,507

(22) Filed: May 20, 2013

(65) Prior Publication Data

US 2014/0339502 A1 Nov. 20, 2014

(51) Int. Cl.
*H01L 33/06* (2010.01)
*H01L 29/15* (2006.01)
(Continued)

(52) U.S. Cl.
CPC ............ *H01L 33/06* (2013.01); *H01L 33/0075* (2013.01); *H01L 33/32* (2013.01)

(58) Field of Classification Search
USPC ...................... 257/14, 21, 80, 81, 91, 99, 184, 257/E51.019
See application file for complete search history.

(56) References Cited

U.S. PATENT DOCUMENTS 5,684,309 A * 11/1997 McIntosh et al. ............. 257/191
5,923,049 A * 7/1999 Bohm et al. .................... 257/55
(Continued)

FOREIGN PATENT DOCUMENTS

| CN | 102208503 A | 10/2011 |
| CN | 202094167 U | 12/2011 |

(Continued)

OTHER PUBLICATIONS

Bayram, C. et al., "A hybrid green light-emitting diode comprised of n-ZnO/(InGaN/GaN) multi-quantum-wells/p-GaN" Appl. Phys. Lett. (Aug. 2008) pp. 081111-1-081111-3, vol. 93.

(Continued)

*Primary Examiner* — Thanh V Pham
(74) *Attorney, Agent, or Firm* — Scully, Scott, Murphy & Presser, P.C.; Louis J. Percello, Esq.

(57) ABSTRACT

A vertical stack including a p-doped GaN portion, a multi-quantum-well including indium gallium nitride layers, and an n-doped transparent conductive material portion is formed on an insulator substrate. A dielectric material liner is formed around the vertical stack, and is patterned to physically expose a surface of the p-doped GaN portion. A selective low temperature epitaxy process is employed to deposit a semiconductor material including at least one elemental semiconductor material on the physically exposed surfaces of the p-doped GaN portion, thereby forming an elemental semiconductor material portion. The selective low temperature epitaxy process can be performed at a temperature lower than 600° C., thereby limiting diffusion of materials within the multi-quantum well and avoiding segregation of indium within the multi-quantum well. The light-emitting diode can generate a radiation of a wide range including blue and green lights in the visible wavelength range.

18 Claims, 8 Drawing Sheets

(51) Int. Cl.
*H01L 33/00* (2010.01)
*H01L 33/32* (2010.01)

(56) References Cited

U.S. PATENT DOCUMENTS

| | | | |
|---|---|---|---|
| 6,100,106 | A | 8/2000 | Yamaguchi et al. |
| 6,492,660 | B2 * | 12/2002 | Uchida ............ 257/79 |
| 8,198,645 | B2 | 6/2012 | Sakai |
| 2012/0043527 | A1 * | 2/2012 | Ding et al. ............ 257/28 |
| 2012/0295417 | A1 | 11/2012 | Adam et al. |
| 2013/0032779 | A1 | 2/2013 | Huang et al. |

FOREIGN PATENT DOCUMENTS

| | | |
|---|---|---|
| CN | 202189826 U | 4/2012 |
| CN | 202549912 U | 11/2012 |
| CN | 102832302 A | 12/2012 |
| JP | 4889142 | 12/2011 |

OTHER PUBLICATIONS

Yen, K.Y. et al., "Performance of InGaN/GaN MQW LEDs Using Ga-Doped ZnO TCLs Prepared by ALD" IEEE Photonics Technology Letters (Dec. 1, 2012) pp. 2105-2108, vol. 24, No. 23.

Li, W. et atl., "Comparative study of ZnO and GaN films grown by MOCVD" IEEE Proceedings: 7th International Conference on Solid-State and Integrated Circuits Technology (Oct. 18-21, 2004) pp. 2374-2377, vol. 3.

Chen, H.C. et al., "UV Electroluminescence and Structure of n-ZnO/p-GaN Heterojunction LEDs Grown by Atomic Layer Deposition" IEEE Journal of Quantum Electronics (Feb. 2010) pp. 265-271, vol. 46, No. 2.

U.S. Office Action dated May 22, 2014 issued in U.S. Appl. No. 14/019,726.

U.S. Office Action dated May 23, 2014 issued in U.S. Appl. No. 14/019,733.

* cited by examiner

ELEMENTAL SEMICONDUCTOR MATERIAL CONTACT FOR HIGH INDIUM CONTENT INGAN LIGHT EMITTING DIODES

RELATED APPLICATIONS

The present application is related to copending U.S. patent application Ser. No. 13/897,508, the entire contents of which are incorporated herein by reference.

BACKGROUND

The present disclosure relates to a semiconductor structure, and particularly to an InGaN-based light emitting diode employing an elemental semiconductor material contact and methods of manufacturing the same.

A multi-quantum well including alternating layers of indium gallium nitride and gallium nitride can be employed to provide light-emitting diodes. The wavelength of the light emitted from such a light-emitting diode can be tuned by adjusting the content of indium in the indium gallium nitride layers. The amount of indium that can be incorporated into the indium gallium nitride layers is limited by the thermal instability of the indium gallium nitride material. Specifically, if the atomic concentration of indium in an indium gallium nitride material exceeds 17%, thermal segregation can occur within the indium gallium nitride material when the temperature is raised above 600° C. During the thermal segregation, indium in the indium gallium nitride alloy segregates from the alloy to form indium portions and remnant indium gallium nitride alloy portions including indium at an atomic concentration lower than 17%. The periodicity in the multi-quantum well is destroyed, and the light-emitting diode becomes non-functional in such cases.

Because metallization processes on gallium nitride materials require temperature processing at elevated temperatures ranging up to 1,000° C., use of indium gallium nitride layers having an atomic concentration of indium greater than 17% has been impossible so far. As a result, the wavelength of light that can be emitted from light-emitting diodes employing a multi-quantum well including an indium gallium nitride layer has been limited to mostly ultraviolet radiations.

SUMMARY

A vertical stack including a p-doped GaN portion, a multi-quantum-well including indium gallium nitride layers, and an n-doped transparent conductive material portion is formed on an insulator substrate. A dielectric material liner is formed around the vertical stack, and is patterned to physically expose a surface of the p-doped GaN portion. A selective low temperature epitaxy process is employed to deposit a semiconductor material including at least one elemental semiconductor material on the physically exposed surfaces of the p-doped GaN portion, thereby forming an elemental semiconductor material portion. The selective low temperature epitaxy process can be performed at a temperature lower than 600° C., thereby limiting diffusion of materials within the multi-quantum well and avoiding segregation of indium within the multi-quantum well. The light-emitting diode can generate a radiation of a wide range including blue and green lights in the visible wavelength range.

According to an aspect of the present disclosure, a semiconductor structure includes a vertical stack located on a substrate. The vertical stack includes, from bottom to top, a p-doped GaN portion, a multi-quantum well located on the p-doped GaN portion, and an n-doped transparent conductive material portion located on the multi-quantum well. The semiconductor structure further includes an elemental semiconductor material portion located directly on the p-doped GaN portion.

According to another aspect of the present disclosure, a method of forming a semiconductor structure is provided. A vertical stack is formed on a substrate. The vertical stack includes, from bottom to top, a p-doped GaN portion, a multi-quantum well located on the p-doped GaN portion, and an n-doped transparent conductive material portion located on the multi-quantum well. An elemental semiconductor material portion including the p-doped GaN portion is formed on the p-doped GaN portion.

DETAILED DESCRIPTION

Figure 1A:
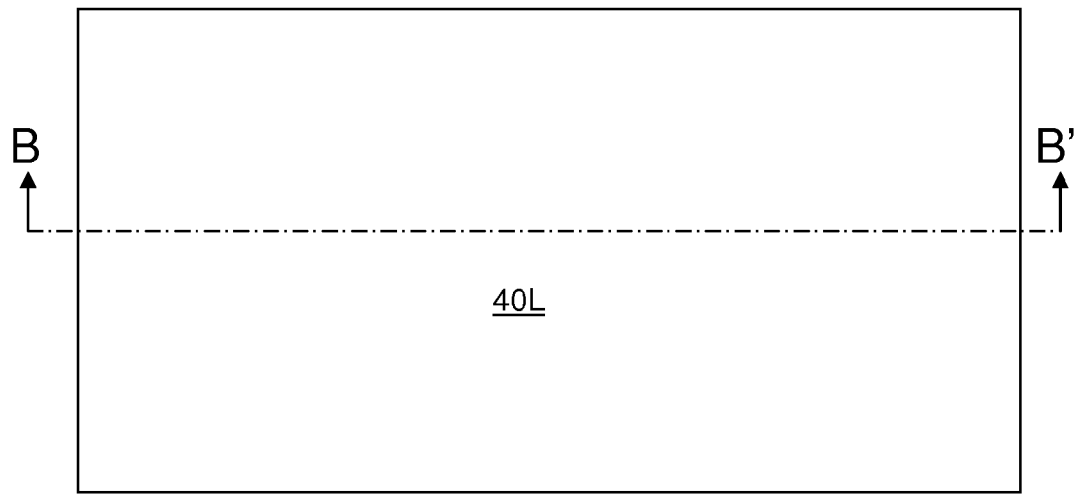
FIG. 1A is a top-down view of a exemplary semiconductor structure after formation of a stack, from bottom to top, of a p-doped GaN layer, a multi-quantum well layer, and a n-doped transparent conductive material layer on a substrate according to an embodiment of the present disclosure.

As stated above, the present disclosure relates to particularly to an InGaN-based light emitting diode and methods of manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

As used herein, a quantum well refers to a thin layer which can confine particles or quasiparticles (such as electrons and holes) in a dimension perpendicular to the layer surface, whereas the movement in the other dimensions is not restricted.

As used herein, a multi-quantum-well refers to a plurality of quantum wells adjoined to one another.

As used herein, a periodic multi-quantum-well refers to a multi-quantum-well in which component quantum wells are arranged in a one-dimensional periodic array.

Figure 1B:
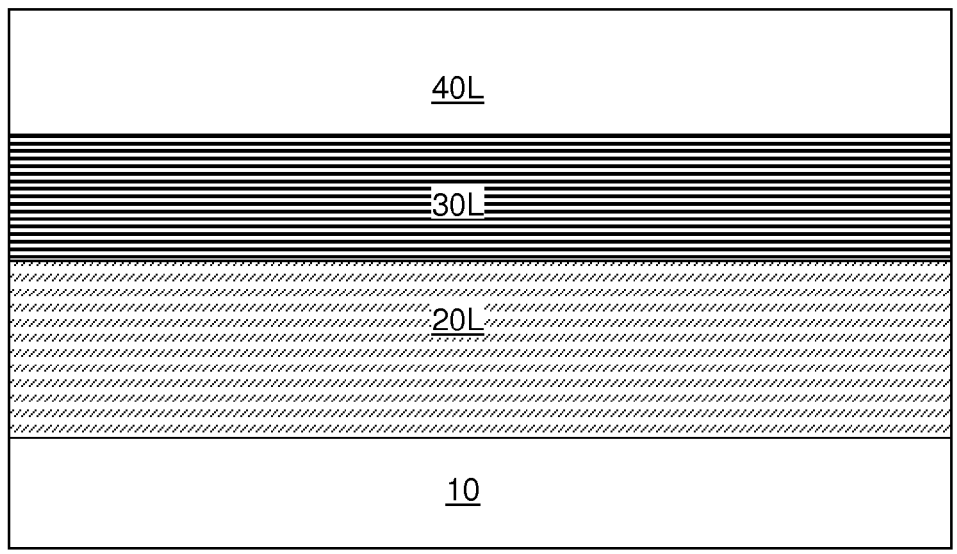
FIG. 1B is a vertical cross-sectional view of the exemplary semiconductor structure along a vertical plane B-B' of FIG. 1A.

Referring to FIGS. 1A and 1B, an exemplary semiconductor structure according to an embodiment of the present disclosure includes a substrate 10 and a stack of material layers formed thereupon. The substrate 10 can be an insulator substrate or an intrinsic compound semiconductor substrate having a high enough resistivity to suppress leakage currents therethrough. For example, if the substrate 10 is an intrinsic compound semiconductor substrate, the resistivity of the substrate 10 can be greater than $10^3$ Ohm-cm at 300K. In one embodiment, the substrate 10 can be a single crystalline insulator substrate or a single crystalline intrinsic compound semiconductor substrate. In one embodiment, the substrate 10 can be a material on which gallium nitride can be epitaxially grown. In one embodiment, the substrate 10 can be a single crystalline sapphire ($Al_2O_3$) substrate, a single crystalline zinc oxide substrate, or a single crystalline silicon carbide substrate. The thickness of the substrate 10 can be selected so as to be able to provide mechanical support to a semiconductor device to be formed thereupon. In one embodiment, the thickness of the substrate 10 can be in a range from 30 microns to 1 mm, although lesser and greater thicknesses can also be employed.

The stack of material layers can include, from bottom to top, a p-doped GaN layer 20L, a multi-quantum well layer 30L, and an n-doped transparent conductive material layer 40L. In one embodiment, the p-doped GaN layer 20L, the multi-quantum well layer 30L, and the n-doped transparent conductive material layer 40L can be single crystalline, and can be formed with epitaxial alignment to the single crystalline structure of the substrate 10. Thus, the entirety of the p-doped GaN layer 20L, the multi-quantum well layer 30L, the n-doped transparent conductive material layer 40L, and the substrate 10 can be single crystalline, i.e., all atoms in the p-doped GaN layer 20L, the multi-quantum well layer 30L, the n-doped transparent conductive material layer 40L, and the substrate 10 can be in epitaxial alignment among one another other than crystallographic defects that are ordinarily found in typical single crystalline materials.

Each of the material layers in the p-doped GaN layer 20L, the multi-quantum well layer 30L, the n-doped transparent conductive material layer 40L can be deposited, for example, by metalorganic chemical vapor deposition (MOCVD). Alternately, other deposition methods such as molecular beam epitaxy (MBE) may be used.

The p-doped GaN layer 20L includes a p-doped single crystalline GaN material. The p-type dopants can be B, Al, Ga, In, or combinations thereof. The thickness of the p-doped GaN layer 20L can be in a range from 10 nm to 1,000 nm, although lesser and greater thicknesses can also be employed. The p-doped GaN layer 20L can consist essentially of single crystalline GaN material and the p-type dopants therein.

The multi-quantum well layer 30L includes a one-dimensional periodic array of a bilayer unit structure. The bilayer unit structure includes a layer of first compound semiconductor material and a layer of a second compound semiconductor material. Each bilayer unit structure is a quantum well. The multi-quantum well layer 30L constitutes a multi-quantum well in which the bilayer unit structures are arranged in a one-dimensional periodic array as component quantum wells. The entirety of the multi-quantum well layer 30L is formed with epitaxial alignment to the p-doped GaN layer 20L.

In one embodiment, the first compound semiconductor material is selected from $In_xGa_{1-x}N$, $Al_xGa_{1-x}N$, and $In_x Al_yGa_{1-x-y}N$, and the second compound semiconductor material is selected from GaN, $In_uGa_{1-u}N$, $Al_uGa_{1-u}N$, and $In_u Al_vGa_{1-u-v}N$. The first and second compound semiconductor materials have different compositions. X, y, u, and v are independently selected numbers greater than 0 and less than 1. Each of a sum of the x and the y (i.e., x+y) and a sum of the u and the v (i.e., u+v) is greater than 0 and less than 1.

In a non-limiting illustrative example, the first compound semiconductor material includes $In_xGa_{1-x}N$ and the second compound semiconductor material includes $In_uGa_{1-u}N$. X is a number greater than 0 and less than 1, and u is a non-negative number less than 1 and different from the x. In one embodiment, the first compound semiconductor material can be a compound of indium, gallium, and nitrogen that induces segregation of indium upon heating above 600° C., and the second compound semiconductor material can be another compound of indium, gallium, and nitrogen that does not induce segregation of indium upon heating above 600° C. For example, the first compound semiconductor material includes $In_xGa_{1-x}N$ and the second compound semiconductor material includes $In_uGa_{1-u}N$ such that x is a number in a range from 0.35 to 0.65, and u is another number in a range from 0 to 0.05. In one embodiment, x can be a number in a range from 0.35 to 0.40. In another embodiment, x can be a number in a range from 0.40 to 0.45. In yet another embodiment, x can be a number in a range from 0.45 to 0.50. In still another embodiment, x can be a number in a range from 0.50 to 0.55. In further another embodiment, x can be a number in a range from 0.55 to 0.60. In yet further another embodiment, x can be a number in a range from 0.60 to 0.65.

The periodicity of the multi-quantum well layer 30L, i.e., the thickness of a single bilayer unit structure, can be in a range from 2 nm to 20 nm, although lesser and greater distances can be employed for the periodicity of the multi-quantum well layer 30L. The number of repetitions of the bilayer unit structure can be in a range from 10 to 100, although lesser and greater numbers of repetition can also be employed.

The n-doped transparent conductive material layer 40L is transparent, and includes an n-doped conductive material. As used herein, a structure is "transparent" if there exists a wavelength within the visible wavelength range at which the structure passes more than 90% of an electromagnetic radiation. The visible wavelength range refers to the wavelength range from 380 nm to 700 nm. As used herein, a material is conductive if the resistivity of the material is less than $10^{-3}$ Ohm-cm. As used herein, a material is semiconducting if the resistivity of the material is in a range from $10^{-3}$ Ohm-cm to $10^3$ Ohm-cm. In one embodiment, the n-doped transparent conductive material can be a II-VI compound semiconductor material. In one embodiment, the n-doped transparent conductive material can be a transparent conductive oxide material. In one embodiment, the n-doped transparent conductive material can be n-doped indium tin oxide (ITO), fluorine-doped tin oxide (FTO), or an n-doped zinc oxide. In one embodiment, the n-doped transparent conductive material can be n-doped zinc oxide.

The thickness of the n-doped transparent conductive material layer 40L can be in a range from 10 nm to 1,000 nm, although lesser and greater thicknesses can also be employed. The n-doped transparent conductive material layer 40L can be single crystalline, or can be polycrystalline. In one embodiment, the n-doped transparent conductive material layer 40L can be single crystalline, and can be epitaxially aligned to the single crystalline structure of the multi-quantum well layer 30L.

Figure 2A:
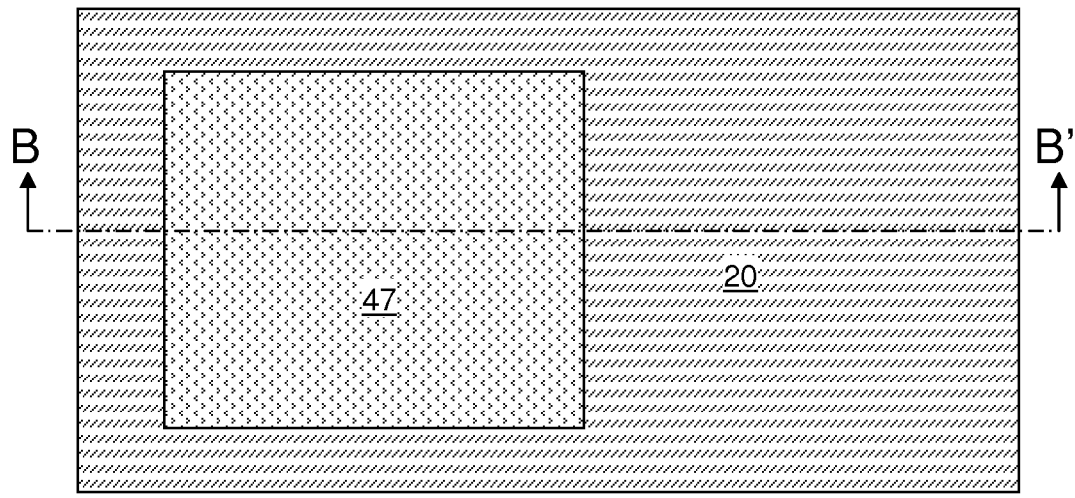
FIG. 2A is a top-down view of the exemplary semiconductor structure after application and lithographic patterning of a photoresist layer, and transfer of the pattern into the n-doped transparent conductive material layer, the multi-quantum well layer, and an upper portion of the p-doped GaN layer according to an embodiment of the present disclosure.
Figure 2B:
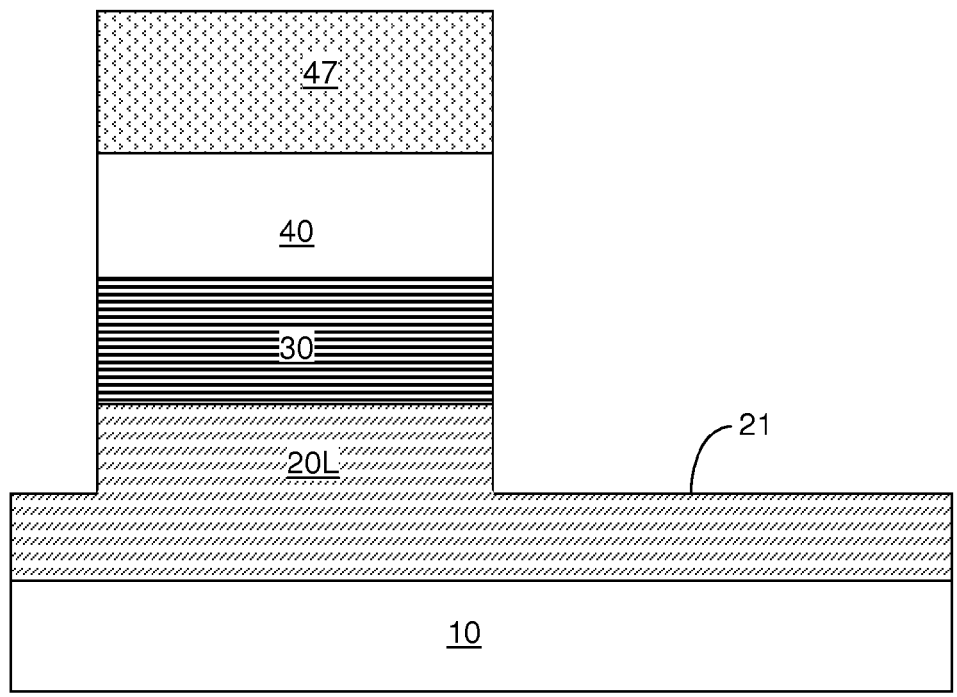
FIG. 2B is a vertical cross-sectional view of the exemplary semiconductor structure along a vertical plane B-B' of FIG. 2A.

Referring to FIGS. 2A and 2B, a first photoresist layer 47 is applied over the top surface of the n-doped transparent conductive material layer 40L, and is lithographically patterned to cover an area within which a stack of material portions is to be subsequently formed. The area covered by the patterned first photoresist layer 47 can be rectangular, circular, elliptical, or otherwise polygonal or of any general closed two-dimensional shape having curved and/or linear edges. The area covered by the patterned first photoresist layer 47 can be determined based on the target level of intensity for emitted light from a light-emitting diode to be subsequently formed with consideration for attenuation by blockage due to a contact structure to be subsequently formed.

The stack including the n-doped transparent conductive material layer 40L, the multi-quantum well layer 30L, and the p-doped GaN layer 20L is anisotropically etched down to a height between a first horizontal plane including an interface between the p-doped GaN layer 20L and the substrate 10 and a second horizontal plane including an interface between the p-doped GaN layer 20L and the multi-quantum well layer 30L. The anisotropic etch can be, for example, a reactive ion etch. The pattern in the first photoresist layer 47 can be transferred into the n-doped transparent conductive material layer 40L, the multi-quantum well layer 30L, and an upper portion of the p-doped GaN layer 20L by the anisotropic etch. The anisotropic etch can be timed, or controlled in another manner, such that the anisotropic etch stops when a recessed horizontal surface 21 of the p-doped GaN layer 20L is between the first horizontal plane including the interface between the p-doped GaN layer 20L and the substrate 10 and the second horizontal plane including the interface between the p-doped GaN layer 20L and the multi-quantum well layer 30L.

An n-doped transparent conductive material portion 40 and a multi-quantum well 30 are formed by the anisotropic etch. The n-doped transparent conductive material portion 40 is a remaining portion of the n-doped transparent conductive material layer 40L, and the multi-quantum well 30 is a remaining portion of the multi-quantum well layer 30L. After the anisotropic etch, the p-doped GaN layer 20L includes an upper portion and a lower portion. The upper portion of the p-doped GaN layer 20L, the multi-quantum well 30, and the n-doped transparent conductive material portion 40 can have a same horizontal cross-sectional area. The upper portion of the p-doped GaN layer 20L, the multi-quantum well 30, and the n-doped transparent conductive material portion 40 can include sidewalls that are vertically coincident with one another. As used herein, a group of surfaces is "vertically coincident" with one another if there exists a vertical plane from which the group of surfaces do not device by more than three times the maximum surface roughness of the group of surfaces. The first photoresist layer 47 is subsequently removed, for example, by ashing.

Figure 3A:
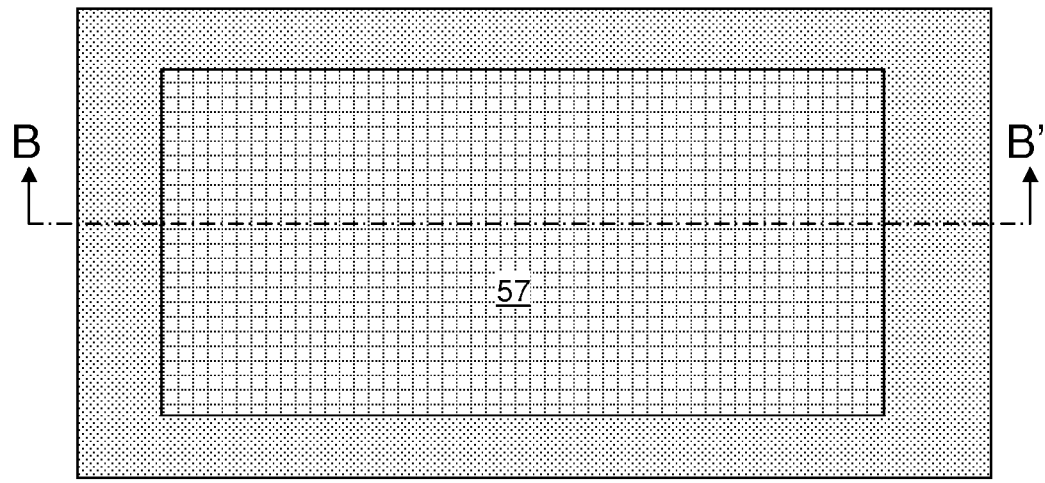
FIG. 3A is a top-down view of the exemplary semiconductor structure after patterning a lower portion of the p-doped GaN layer according to an embodiment of the present disclosure.
Figure 3B:
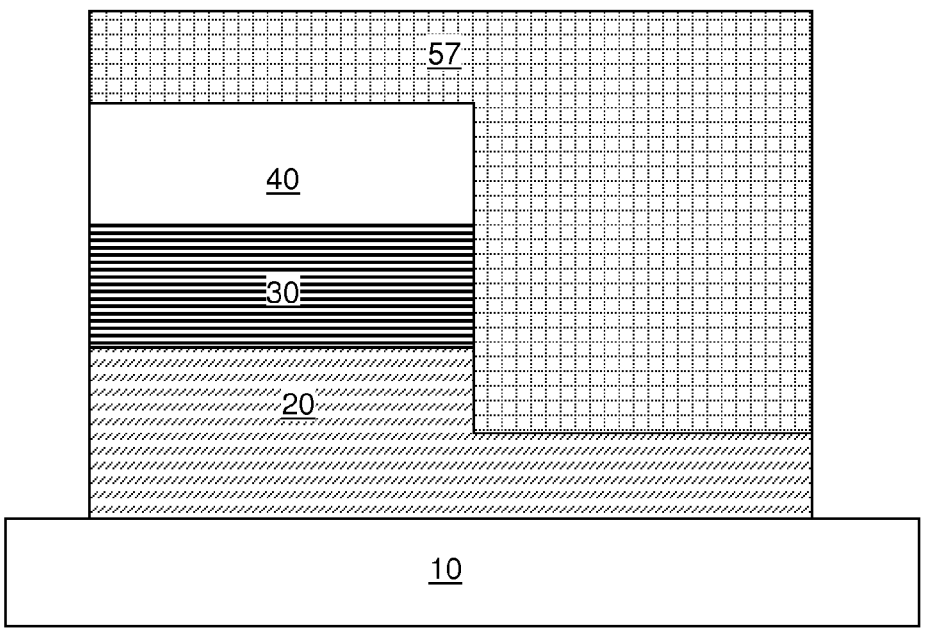
FIG. 3B is a vertical cross-sectional view of the exemplary semiconductor structure along a vertical plane B-B' of FIG. 3A.

Referring to FIGS. 3A and 3B, a lower portion of the p-doped GaN layer 20L is patterned. The patterning of the lower portion of the p-doped GaN layer 20L can be performed, for example, by applying and lithographically patterning a second photoresist layer 57, and transferring the pattern in the patterned second photoresist layer 57 into the lower portion of the p-doped GaN layer 20L by an anisotropic etch. The area covered by the patterned second photoresist layer 57 includes all of the area of the patterned first photoresist layer 47 and an additional area.

A remaining portion of the p-doped GaN layer 20L after the anisotropic etch is herein referred to as a p-doped GaN portion 20. The p-doped GaN portion 20 includes an upper portion and a lower portion. The upper portion of the p-doped GaN portion 20, the multi-quantum well 30, and the n-doped transparent conductive material portion 40 have a same horizontal cross-sectional area. The lower portion of the p-doped GaN portion 20 has a horizontal cross-sectional area that includes all of the same horizontal cross-sectional area and an additional horizontal cross-sectional area. Thus, the p-doped GaN portion 20 is formed by patterning the p-doped GaN layer 20L such that the lower portion (that is located below the horizontal plane including the recessed horizontal surface 21; See FIG. 2B) of the p-doped GaN portion 20 has a horizontal cross-sectional area that includes all of a horizontal cross-sectional area of the upper portion (that is located above the horizontal plane including the recessed horizontal surface 21; See FIG. 2B) of the p-doped GaN portion 20 and an additional horizontal cross-sectional area.

A vertical stack (20, 30, 40) including material portions is formed on the substrate 10. The vertical stack (20, 30, 40) includes, from bottom to top, the p-doped GaN portion 20 having a doping of the first conductivity type, the multi-quantum well 30 located on the p-doped GaN portion 20, and the n-doped transparent conductive material portion 40 located on the multi-quantum well 30 and having a doping of the second conductivity type that is the opposite of the first conductivity type. The p-doped GaN portion 20 is a p-doped GaN portion, and the n-doped transparent conductive material portion 40 is an n-doped GaN portion. The second photoresist layer 57 is subsequently removed, for example, by ashing.

Figure 4A:
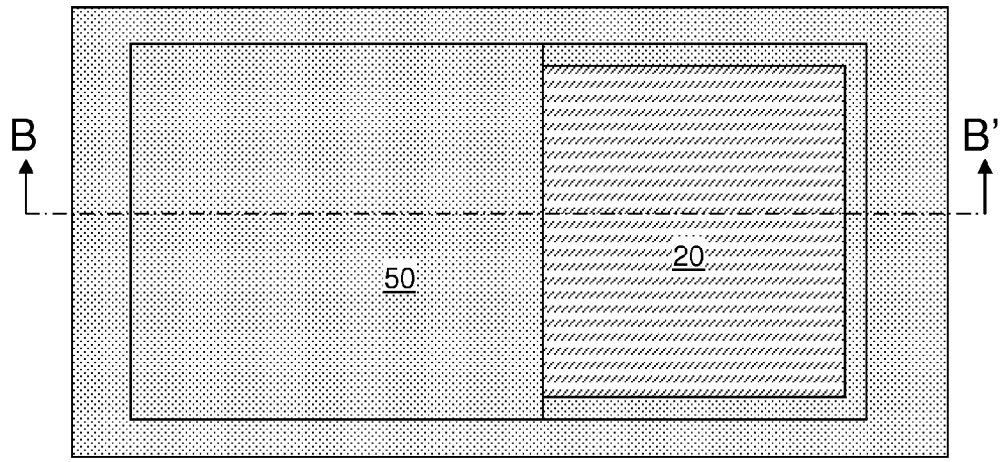
FIG. 4A is a top-down view of the exemplary semiconductor structure after deposition of a dielectric material liner according to an embodiment of the present disclosure.
Figure 4B:
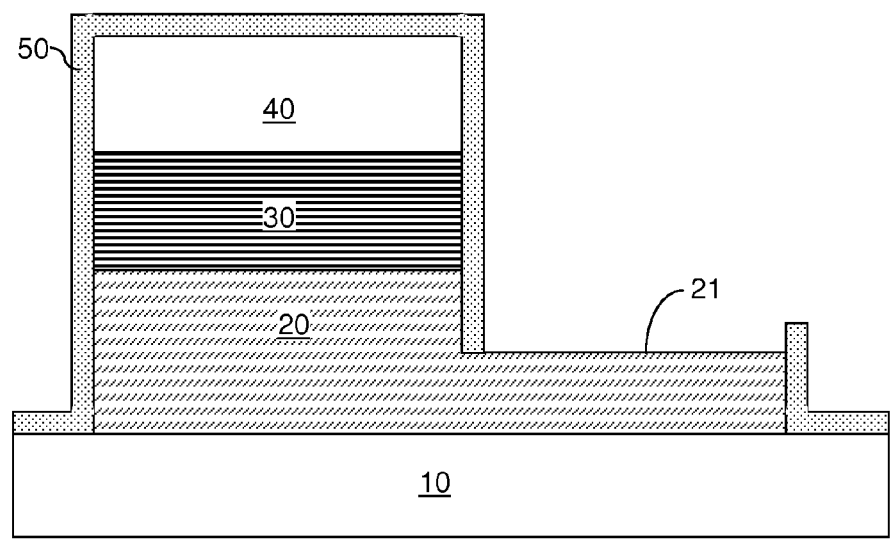
FIG. 4B is a vertical cross-sectional view of the exemplary semiconductor structure along a vertical plane B-B' of FIG. 4A.

Referring to FIGS. 4A and 4B, a dielectric material liner 50 can be formed on physically exposed surfaces of the vertical stack (20, 30, 40) and physically exposed portions of the top surface of the substrate 10. The dielectric material liner 50 includes a dielectric material such as silicon nitride, silicon oxide, silicon oxynitride, a dielectric metal oxide, a dielectric metal nitride, a dielectric metal oxynitride, or a combination thereof. The dielectric material liner 50 can be deposited, for example, by chemical vapor deposition (CVD) or atomic layer deposition (ALD). The dielectric material liner 50 can be deposited conformally, i.e., such that horizontal portions and vertical portions of the dielectric material liner 50 have substantially the same thickness. The thickness of the dielectric material liner 50, as measured on sidewalls of the vertical stack (20, 30, 40) can be in a range from 3 nm to 100 nm, although lesser and greater thicknesses can also be employed.

A portion of the dielectric material liner 50 can be removed from above the recessed horizontal surface 21 to physically expose a portion of the recessed horizontal surface 21. The physical exposure of a portion of the recessed horizontal surface 21 can be effected, for example, by applying a photoresist layer (not shown), lithographically patterning the photoresist layer to form an opening overlying a portion of the recessed horizontal surface 21, and by etching physically exposed portions of the dielectric material liner 50 from underneath the opening in the patterned photoresist layer by an etch. The etch can be an isotropic etch (such as a wet etch) or an anisotropic etch (such as a reactive ion etch). The patterned photoresist layer is subsequently removed, for example, by ashing. After formation of an opening in the dielectric material liner 50 and physical exposure of a portion of the recessed horizontal surface 21 within the area of the opening in the dielectric material liner 50, the dielectric material liner 50 laterally surrounds the vertical stack (20, 30, 40).

Figure 5A:
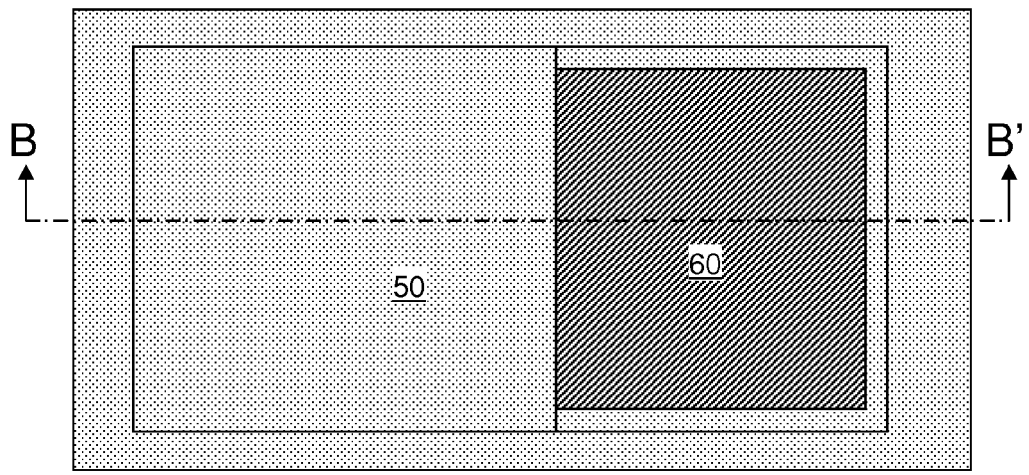
FIG. 5A is a top-down view of the exemplary semiconductor structure after formation of an opening in the dielectric material liner and formation of an elemental semiconductor material portion on a p-doped GaN portion according to an embodiment of the present disclosure.
Figure 5B:
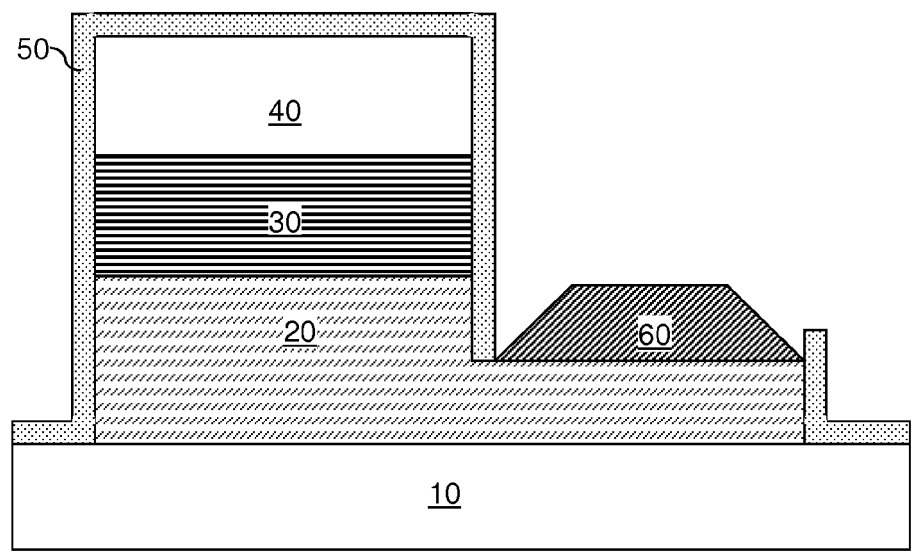
FIG. 5B is a vertical cross-sectional view of the exemplary semiconductor structure along a vertical plane B-B' of FIG. 5A.

Referring to FIGS. 5A and 5B, at least one elemental semiconductor material is deposited on the physically exposed surface of the p-doped GaN portion 20 by a selective deposition process. As used herein, a selective deposition process refers to a deposition process that deposits a material on surfaces of a first type, while not depositing any material on surfaces of a second type. Specifically, the at least one elemental semiconductor material can be deposited on crystalline surfaces that include physically exposed semiconductor surfaces, while not being deposited on amorphous surfaces such as dielectric surfaces or metallic surfaces. As used herein, a crystalline surface refers to a surface that displays single crystalline or polycrystalline arrangement of atoms. As used herein, an amorphous surface refers to a surface that does not display single crystalline or polycrystalline arrangement of atoms. As used herein, an amorphous surface refers to a surface that does not display single crystalline or polycrystalline arrangement of atoms. An elemental semiconductor material portion 60 including the deposited at least one elemental semiconductor material is formed directly on the physically exposed surface of the p-doped GaN portion 20.

As used herein, an elemental semiconductor material refers to silicon, germanium, and carbon. The at least one elemental semiconductor material can include a single elemental semiconductor element, or can include an alloy of at least two elemental semiconductor elements. Thus, the at least one elemental semiconductor material as deposited can be elemental silicon, elemental germanium, a silicon-germanium alloy, a silicon-carbon alloy, or a silicon-germanium-carbon alloy. The at least one elemental semiconductor material in the elemental semiconductor material portion 60 can be intrinsic, or can be doped with p-type dopants such as B, Ga, or In.

In an exemplary embodiment, the at least one elemental semiconductor material can be a crystalline silicon-and-hydrogen-containing material. The crystalline silicon-and-hydrogen-containing material includes silicon and hydrogen, and can be single-crystalline or polycrystalline. Thus, the elemental semiconductor material portion 60 includes the crystalline silicon-and-hydrogen-containing material.

The crystalline silicon-and-hydrogen-containing material can be deposited, for example, by plasma-enhanced chemical vapor deposition (PECVD) or by hot-wire CVD (HWCVD). The deposition temperature can be in a range from room temperature (i.e., 20° C.) to 450° C. In one embodiment, the crystalline silicon-and-hydrogen-containing material can be deposited at a deposition temperature in a range from 150° C. to 250° C.

If a PECVD process or a HWCVD process is employed to deposit the crystalline silicon-and-hydrogen-containing material, the gas sources (precursor gases) used for the growth of the crystalline silicon-and-hydrogen-containing material may include, but are not limited to, $SiH_4$ (silane), $Si_2H_6$ (disilane), $SiH_2Cl_2$ (dichlorosilane), $SiF_4$ (tetrafluorosilane), and combinations thereof. Hydrogen gas may be employed as a carrier gas (i.e., a dilution gas). In one embodiment, the ratio of the flow rate of the carrier gas to the flow rate of the precursor gas can be greater than 5.

The crystalline silicon-and-hydrogen-containing material can be in-situ doped, for example, by providing a dopant gas in the process chamber. In one embodiment, the dopant gas can be $B_2H_6$ (diborane) or trimethylboron (TMB) for p-type doping. The concentration of activated dopants in the elemental semiconductor material portion 60 can be in a range from $1.0\times10^{18}/cm^3$ to $3.0\times10^{20}/cm^3$, although lesser and greater concentrations of activated dopants can also be employed. The total concentration of dopants in the elemental semiconductor material portion 60 can be in a range from $1.0\times10^{18}/cm^3$ to $1.0\times10^{21}/cm^3$, although lesser and greater total concentrations of dopants can also be employed. The content of hydrogen in the deposited crystalline silicon-and-hydrogen-containing material can be in a range from 5 atomic percent to 40 atomic percent, although lesser and greater atomic percentages can also be employed.

The crystalline silicon-and-hydrogen-containing material may additionally contain germanium (Ge), nitrogen (N), oxygen (O), fluorine (F), deuterium (D), chlorine (Cl), carbon (C) and/or combinations thereof. The gas source employed for incorporating germanium can be, for example, germane ($GeH_4$). The gas source employed for incorporating carbon can be, for example, methane ($CH_4$), ethylene ($C_2H_4$), propylene ($C_3H_6$), and other hydrocarbon gases having a formula of $C_xH_y$, in which x is an integer greater than 1, and y is not greater than 2x+2.

In one embodiment, selective growth of the crystalline silicon-and-hydrogen-containing material may be obtained by in-situ etching of non-crystalline (i.e., amorphous) silicon-and-hydrogen-containing material in a hydrogen ($H_2$) plasma. An etching process of the amorphous silicon-and-hydrogen-containing material is employed to concurrently form epitaxial silicon-and-hydrogen-containing material on exposed single crystalline surfaces of the p-doped GaN portion 20. It should be understood that the epitaxial growth and etching may be performed sequentially or concurrently as needed.

In a non-limiting illustrative example, the crystalline silicon-and-hydrogen-containing material can be deposited at a pressure of about 500 mTorr, at a ratio of $H_2$ flow rate to $SiH_4$ flow rate of about 14, and at a power density of about 4 $mW/cm^2$. A $H_2$ plasma etch can be performed at a temperature of about 150° C. at about 900 mTorr, resulting in an etch selectivity of approximately 1:3 for the crystalline silicon-and-hydrogen-containing material with respect to an amorphous silicon-and-hydrogen-containing material. It should be understood that the amorphous silicon-and-hydrogen-containing material grown on the gate electrode 50, the shallow trench isolation structures 32, and the dielectric material layer 40 are etched using a plasma of a gas, which can be one or a combination of $H_2$, HCl, $CL_2$, Ar, etc. The epitaxial deposition and the plasma etch may be performed sequentially or concurrently in a same chamber. The selective epitaxial growth can be achieved either by alternating gas pulses responsible for the epitaxial growth (e.g., silane and dopant species) and the etch (plasma etchants.) or by simultaneous flow of all the gases. Further details regarding the epitaxial growth and selective removal process are described in U.S. Patent Application Publication No. 2012/0210932 to Hekmatshoar-Tabari published on Aug. 23, 2012, the entire contents of which are incorporated herein by reference.

Thus, the elemental semiconductor material portion 60 is formed by selectively depositing the at least one elemental semiconductor material on the physically exposed surface of the p-doped GaN portion 20. A bottom surface of the elemental semiconductor material portion 60 can be in contact with the single crystalline p-doped gallium nitride material of the p-doped GaN portion 20. The elemental semiconductor material portion 60 contacts a horizontal surface (e.g., the recessed horizontal surface 21 illustrated in FIG. 2B) of the p-doped GaN portion 20 such that the horizontal surface is located between the first horizontal plane including the interface between the p-doped GaN portion 20 and the substrate 10 and the second horizontal plane including the interface between the p-doped GaN portion 20 and the multi-quantum well 30. In other words, the height of the horizontal surface of the interface between the p-doped GaN portion 20 and the elemental semiconductor material portion 60 is located at the first height between the first horizontal plane and the second horizontal plane. The entire area of an interface between the elemental semiconductor material portion 60 and the p-doped GaN portion 20 is within the additional horizontal cross-sectional area that does not overlap with the horizontal cross-sectional area of the n-doped transparent conductive material portion 40, the multi-quantum well 30, and the upper portion of the p-doped GaN portion 20. The physical contact between the p-doped GaN portion 20 and the elemental semiconductor material portion 60 is provided through an opening in the dielectric material liner 50.

In one embodiment, the at least one elemental semiconductor material can be deposited by selective epitaxy with epitaxial alignment with the single crystalline gallium nitride material of the p-doped GaN portion 20. In yet another embodiment, the elemental semiconductor material portion 60 can include a single crystalline or polycrystalline silicon material, a single crystalline or polycrystalline germanium material, or a single crystalline or polycrystalline alloy of silicon and germanium. In one embodiment, the elemental semiconductor material portion 60 can consist essentially of the at least one semiconductor material, hydrogen atoms, and electrical dopant atoms. As used herein, electrical dopant atoms refer to p-type dopant atoms and/or n-type dopant atoms.

Figure 6A:
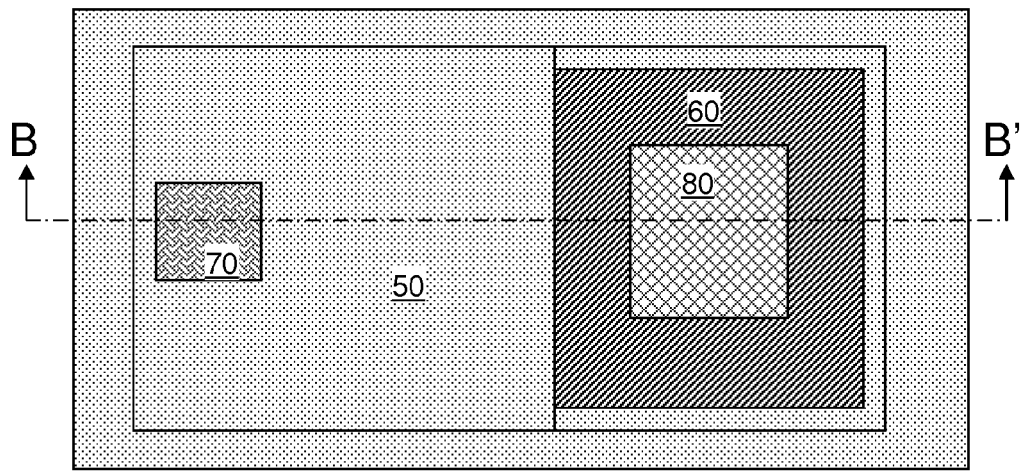
FIG. 6A is a top-down view of the exemplary semiconductor structure after formation of contact structures on the n-doped transparent conductive material portion and the elemental semiconductor material portion according to an embodiment of the present disclosure.
Figure 6B:
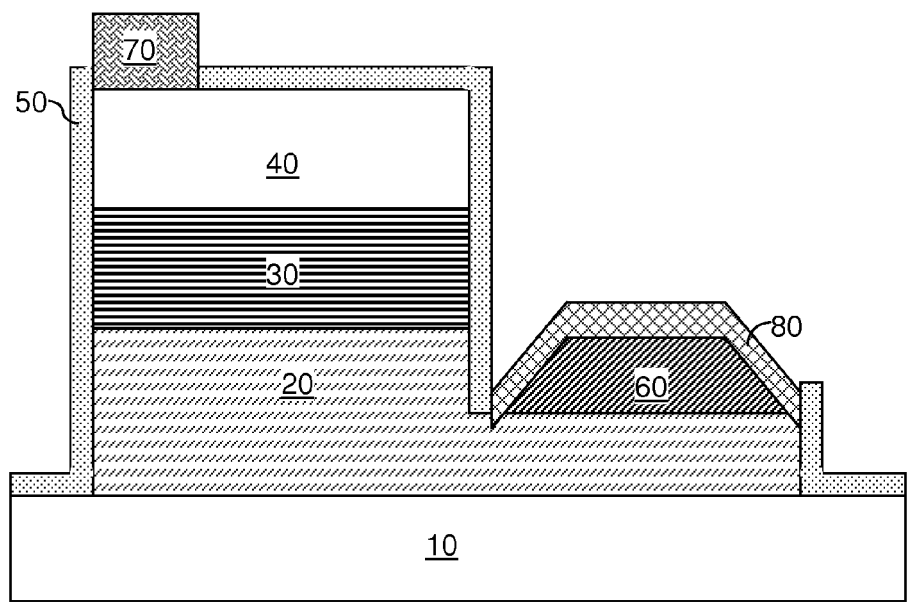
FIG. 6B is a vertical cross-sectional view of the exemplary semiconductor structure along a vertical plane B-B' of FIG. 6A.

Referring to FIGS. 6A and 6B, contact structures are formed on the n-doped transparent conductive material portion 40 and the elemental semiconductor material portion 60 by metallization processes. A first contact structure 80 is formed directly on the elemental semiconductor material portion 60, and a second contact structure 70 is formed directly on the n-doped transparent conductive material portion 40. The first contact structure 80 can be formed prior to formation of the second contact structure 70, or can be formed after formation of the second contact structure 70.

For formation of the first contact structure 80, a metallic material can be deposited on the top surface of the elemental semiconductor material portion 60. The metallic material can be a material that interacts with the semiconductor material of the elemental semiconductor material portion 60 to form a metal-semiconductor alloy such as metal silicides. For example, the deposited metallic material can be nickel or a nickel alloy. The metallic material can be deposited, for example, by physical vapor deposition (PVD). The thickness of the deposited metallic material can be in a range from 3 nm to 30 nm, although lesser and greater thicknesses can also be employed. The material of the n-doped transparent conductive material portion 40, the multi-quantum well 30, and the sidewalls of the p-doped GaN portion 20 can be spaced from the deposited metallic material by the dielectric material liner 50.

A metallization anneal is performed at an elevated temperature to form a metal-semiconductor alloy portion directly on a top surface of the elemental semiconductor material portion 60. The metal-semiconductor alloy portion constitutes the first contact structure 80. If the elemental semiconductor material portion 60 includes a crystalline silicon-and-hydrogen-containing material, the first contact structure 80 includes an alloy of the crystalline silicon-and-hydrogen-containing material and the deposited metallic material such as nickel silicide, nickel germanide, and nickel germanosilicide. The temperature of the metallization anneal can be lower than 600° C. The hydrogen content of the elemental semiconductor material portion 60 may decrease after the metallization anneal may be in a range from 0.1 atomic percent to 20 atomic percent, although lesser and greater atomic percentages can also be employed. The thickness of the first contact structure 80 can be in a range from 5 nm to 50 nm, although lesser and greater thicknesses can also be employed.

Unreacted portion of the deposited metallic material can be removed selective to the first contact structure 80 by a wet etch. The chemistry of the wet etch is selected such that unreacted portions of the deposited metallic material can be etched selective to the metal-semiconductor alloy portions that constitutes the first contact structure 80.

The at least one elemental semiconductor material is conducive to metallization at a lower temperature than the p-doped gallium nitride material of the p-doped GaN portion 20. As such, the at least one elemental semiconductor material of the elemental semiconductor material portion 60, which can include single crystalline or polycrystalline silicon, single crystalline or polycrystalline germanium, a single crystalline or polycrystalline silicon-germanium alloy, or a single crystalline or polycrystalline silicon-germanium-carbon alloy, can be provided with an Ohmic contact through formation of a metal silicide, a metal germanide, or a metal germanosilicide at a lower temperature than is necessary for formation of a metal-semiconductor alloy including a p-doped gallium nitride. Thus, a lower temperature anneal process can be employed to provide metallization contacts to the elemental semiconductor material portion 60 of the present disclosure compared with methods for providing metallization directly on a p-doped GaN material. Therefore, bulk diffusion in the multi-quantum well 30 in the light-emitting diode of the present disclosure can be significantly reduced relative to prior art methods.

The second contact structure 70 is formed by patterning an opening through a portion of the dielectric material liner 50 that overlies the top surface of the n-doped transparent conductive material portion 40. Formation of the opening through the dielectric material liner 50 and physical exposure of a portion of the top surface of the n-doped transparent conductive material portion 40 can be performed, for example, by application of a photoresist layer (not shown), lithographic patterning of the photoresist layer to form an opening overlying the n-doped transparent conductive material portion 40, and transferring the pattern in the photoresist layer through the portion of the dielectric material liner 50 within the opening. At least one metallic material can be subsequently deposited by a directional deposition method to form the second contact structure 70. The directional deposition method can be vacuum evaporation or collimated physical vapor deposition. The at least one metallic material can include W, a combination of Ni, Pt, and Au that forms a stack, from bottom to top, of Ni/Pt/Au, a combination of Ti and Au that forms a stack, from bottom to top, of Ti/Au, a combination of Ti, Pt, and Au that forms a stack, from bottom to top, of Ti/Pt/Au, and a combination of Al and Ti that forms a stack, from bottom to top, of Al/Ti. The photoresist layer and additional metallic materials above the photoresist layer can be removed, for example, by lifting off the photoresist layer employing a solvent. An anneal may be optionally performed provided that the temperature of the anneal is not elevated to a temperature that adversely affects the band gap profile of the multi-quantum well 30 or provides bulk diffusion of the compound semiconductor materials in the multi-quantum well 30. In one embodiment, the temperature of the anneal is selected to be less than 600° C. to avoid adversely affecting the band gap profile of the multi-quantum well 30 and to avoid bulk diffusion of the compound semiconductor materials in the multi-quantum well 30. In one embodiment, the area of the second contact structure 70 is minimized in order to provide as much area for light emission from the multi-quantum well as possible while providing sufficient electrical current to the n-doped transparent conductive material portion 40.

Figure 7A:
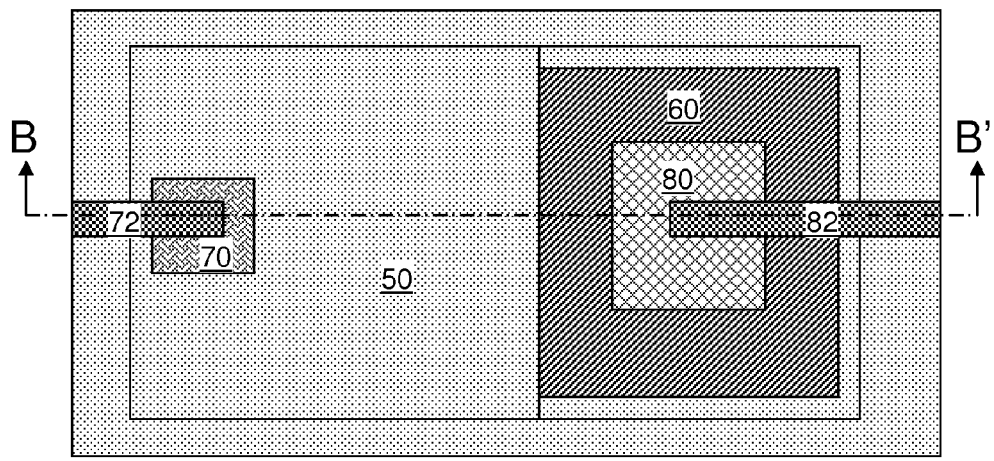
FIG. 7A is a top-down view of the exemplary semiconductor structure after formation of contact wires according to an embodiment of the present disclosure.
Figure 7B:
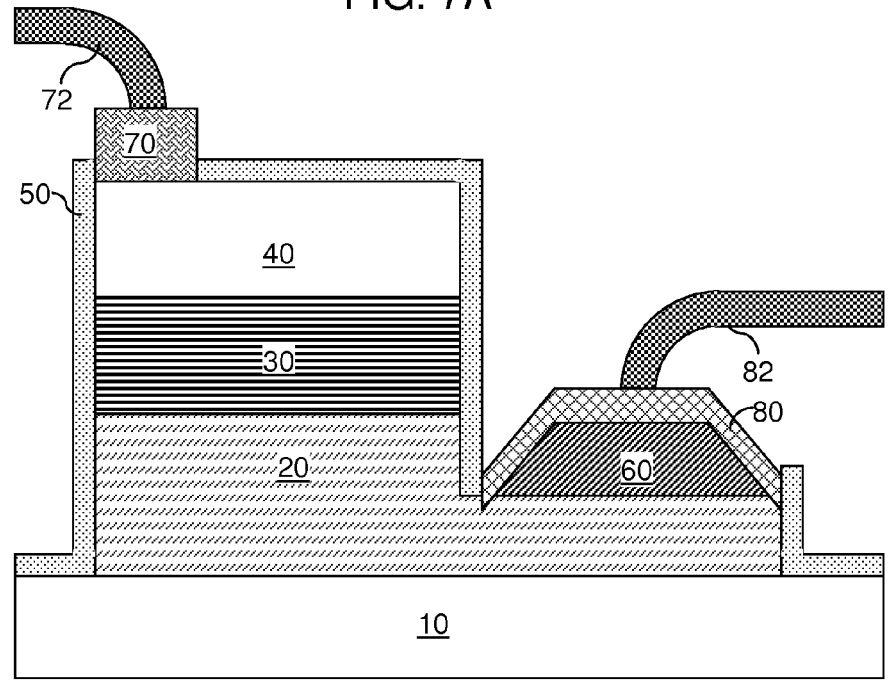
FIG. 7B is a vertical cross-sectional view of the exemplary semiconductor structure along a vertical plane B-B' of FIG. 7A.

Referring to FIGS. 7A and 7B, electrical wiring structures can be subsequently formed on the first contact structure 80 and the second contact structure 70. The electrical wiring structures can include a first contact wire 82 attached to the first contact structure 80 and a second contact wire 72 attached to the second contact structure 70. Optionally, soldering methods can also be employed. A dielectric material layer (not shown) can be optionally formed over the first and second contact structures (80, 70). In one embodiment, contact via structures (not shown) embedded within a dielectric material layer can be employed to provide electrical contact to the first contact structure 80 and the second contact structure in lieu of the first contact wire 82 and the first contact wire 72.

Figure 8A:
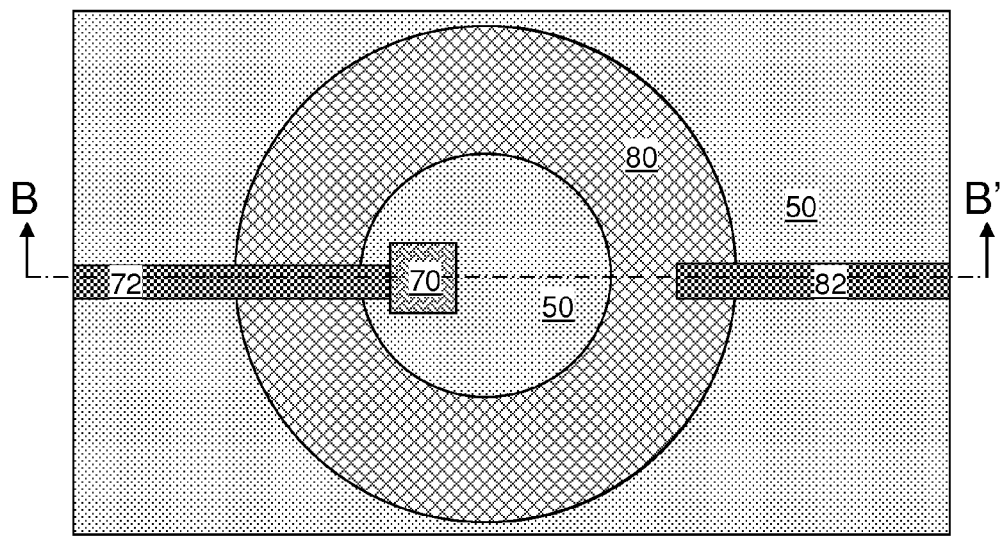
FIG. 8A is a top-down view of a variation of the exemplary semiconductor structure according to an embodiment of the present disclosure.
Figure 8B:
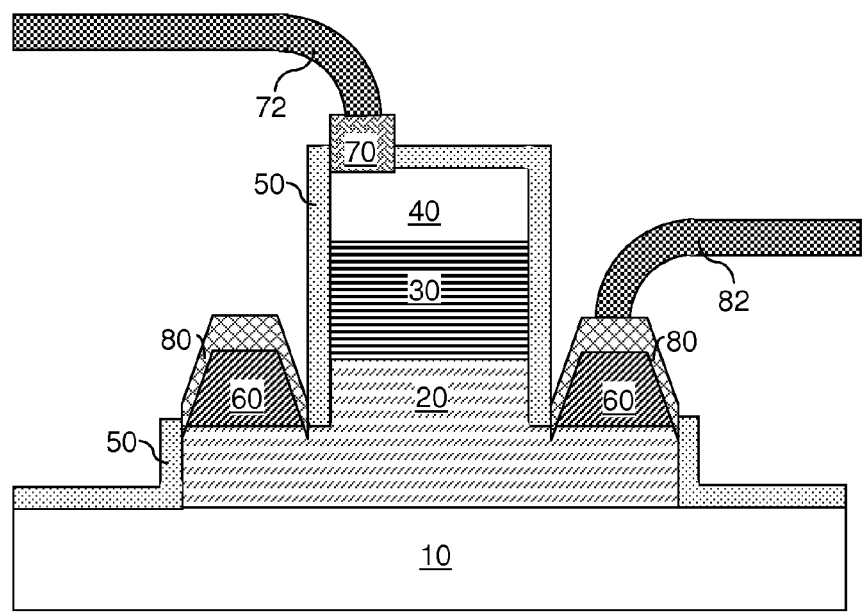
FIG. 8B is a vertical cross-sectional view of the variation of the exemplary semiconductor structure of FIG. 8A.

Referring to FIGS. 8A and 8B, a variation of the exemplary semiconductor structure can be derived from the exemplary semiconductor structure by altering topology of the top surface of the p-doped GaN portion 20 that makes contact with the elemental semiconductor material portion 60. For example, the interface at which the p-doped GaN material of the p-doped GaN portion contacts the silicon-and-hydrogen-containing material of the elemental semiconductor material portion 60 can be ring-shaped, and the horizontal cross-sectional area of the interface can laterally enclose the horizontal cross-sectional area of the stack of the n-doped transparent conductive material portion 40, the multi-quantum well 30, and the upper portion of the p-doped GaN portion 20.

The light-emitting diode of the present disclosure can include any compound semiconductor materials that provided that such compound semiconductor material are stable in a temperature range from room temperature to 600° C. For example, if the multi-quantum well 30 includes an indium gallium nitride material as the first single crystalline compound semiconductor material, the ability to provide metallization to the p-doped GaN portion 20 without raising the temperature of the exemplary semiconductor structure to 600° C. removes the limitation on the content of indium within the single crystalline compound semiconductor material. Thus, the value of x in a compound semiconductor material having a formula of $In_xGa_{1-x}N$ can be any number greater than 0 and less than 1 without concern over thermal stability above the temperature of 600° C.

Such an ability to expand the compositional range in a compound semiconductor material enables formation of light-emitting diodes that can emit light in wavelength ranges hithertofore unavailable for light-emitting diodes. In an illustrative example, a light-emitting diode can employ $In_xGa_{1-x}N$ as a first compound single crystalline semiconductor material and GaN as a second compound single crystalline semiconductor material in a multi-quantum well 30. If the value of x is about 0.02, the wavelength of emitted light from the light-emitting diode is in the ultraviolet range, i.e., less than 380 nm. If the value of x is about 0.10, the wavelength of emitted light from the light-emitting diode is about 390 nm. If the value of x is about 0.20, the wavelength of emitted light from the light-emitting diode is about 420 nm. If the value of x is about 0.30, the wavelength of emitted light from the light-emitting diode is about 440 nm. If the value of x is about 0.35, the wavelength of emitted light from the light-emitting diode is about 460 nm. If the value of x is about 0.40, the wavelength of emitted light from the light-emitting diode is about 490 nm. If the value of x is about 0.45, the wavelength of emitted light from the light-emitting diode is about 520 nm. If the value of x is about 0.50, the wavelength of emitted light from the light-emitting diode is about 550 nm. If the value of x is greater than 0.50, the wavelength of emitted light from the light-emitting diode can be greater than 550 nm. If the value of x is about 0.65, the wavelength of emitted light from the light-emitting diode can be about 650 nm. For a range of x from 0.02 to 0.65, all visible wavelengths less than 650 nm (i.e., wavelengths from 380 nm to 650 nm) can be emitted by selection of the proper value of x employing a InGaN-based light-emitting diode according to an embodiment of the present disclosure. Thus, the wavelength of the light to be emitted from the light-emitting diode can be selected from a wider range of wavelengths than previously available wavelength ranges for light-emitting diodes employing indium gallium nitride. In one embodiment, the light emitted from the light-emitting diode of the present disclosure can be purple, blue, green, yellow, orange, or red, with a corresponding wavelength in a range from 380 nm to 650 nm. In one embodiment, light having a wavelength greater than 460 nm can be emitted from the light-emitting diode of the present disclosure. In one embodiment, the light emitted from the light-emitting diode of the present disclosure can be green, yellow, orange, or red, with a corresponding wavelength in a range from 490 nm to 650 nm.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising:
    a vertical stack located on a substrate, said vertical stack comprising, from bottom to top:
        a p-doped GaN portion having a single crystalline structure,
        a multi-quantum well located on said p-doped GaN portion, and an n-doped transparent conductive material portion located on said multi-quantum well; and an elemental semiconductor material portion located directly on said p-doped GaN portion, said elemental semiconductor material portion being single crystalline and in epitaxial alignment with said single crystalline structure of said p-doped GaN portion.

2. The semiconductor structure of claim 1, wherein said multi-quantum well comprises a one-dimensional periodic array of a bilayer unit structure, said bilayer unit structure comprising a first compound semiconductor material and a second compound semiconductor material.

3. The semiconductor structure of claim 2, wherein said first compound semiconductor material is selected from $In_xGa_{1-x}N$, $Al_xGa_{1-x}N$, and $In_xAl_yGa_{1-x-y}N$, and said second compound semiconductor material is selected from GaN, $In_uGa_{1-u}N$, $Al_uGa_{1-u}N$, and $In_uAl_vGa_{1-u-v}N$, wherein said first and second compound semiconductor materials have different compositions, and said x, said y, said u, and said v are independently selected numbers greater than 0 and less than 1, and each of a sum of said x and said y and a sum of said u and said v is greater than 0 and less than 1.

4. The semiconductor structure of claim 2, wherein said first compound semiconductor material comprises $In_xGa_{1-x}N$ and said second compound semiconductor material comprises $In_uGa_{1-u}N$, wherein said x is a number greater than 0 and less than 1, and said u is a non-negative number less than 1 and different from said x.

5. The semiconductor structure of claim 4, wherein said x is in a range from 0.35 to 0.65, and said u is in a range from 0 to 0.05.

6. The semiconductor structure of claim 1, wherein said p-doped GaN portion, said multi-quantum well, and said n-doped transparent conductive material portion are single crystalline, and are epitaxially aligned among one another.

7. The semiconductor structure of claim 1, wherein said p-doped GaN portion includes an upper portion and a lower portion, wherein said upper portion, said multi-quantum well, and said n-doped transparent conductive material portion have a same horizontal cross-sectional area.

8. The semiconductor structure of claim 7, wherein said lower portion has a horizontal cross-sectional area that includes all of said same horizontal cross-sectional area and an additional horizontal cross-sectional area.

9. The semiconductor structure of claim 8, wherein an entire area of an interface between said elemental semiconductor material portion and said first GaN portion is within said additional horizontal cross-sectional area.

10. The semiconductor structure of claim 7, wherein said elemental semiconductor material portion contacts a horizontal surface of said p-doped GaN portion, wherein said horizontal surface is located between a first horizontal plane including an interface between said p-doped GaN portion and said substrate and a second horizontal plane including an interface between said p-doped GaN portion and said multi-quantum well.

11. The semiconductor structure of claim 1, further comprising a dielectric material liner laterally surrounding said vertical stack and including an opening through which said elemental semiconductor material portion contacts said p-doped GaN portion.

12. The semiconductor structure of claim 1, wherein said elemental semiconductor material portion comprises a crystalline silicon-and-hydrogen-containing material.

13. The semiconductor structure of claim 1, wherein said elemental semiconductor material portion is a p-doped single crystalline elemental semiconductor material portion.

14. The semiconductor structure of claim 13, wherein said p-doped single crystalline elemental semiconductor material portion comprises a material selected from p-doped single crystalline silicon, p-doped single crystalline germanium, a p-doped single crystalline silicon-germanium alloy, a p-doped single crystalline silicon-carbon alloy, or a p-doped single crystalline silicon-germanium-carbon alloy.

15. The semiconductor structure of claim 13, further comprising a contact structure located on said elemental semiconductor material portion and containing a metal-semiconductor alloy of at least one elemental semiconductor material and a metal.

16. The semiconductor structure of claim 15, further comprising another contact structure located on said n-doped transparent conductive material portion and having a different composition than said contact structure.

17. The semiconductor structure of claim 16, wherein said another contact structure comprises at least one of W, Au, and Al.

18. The semiconductor structure of claim 17, wherein said metal-semiconductor alloy is an alloy of said at least one elemental semiconductor material and nickel.

* * * * *